(12) United States Patent
Tung et al.

(10) Patent No.: US 11,913,981 B2
(45) Date of Patent: Feb. 27, 2024

(54) ELECTROSTATIC SENSING SYSTEM AND ELECTROSTATIC SENSING ASSEMBLY

(71) Applicant: INDUSTRIAL TECHNOLOGY RESEARCH INSTITUTE, Hsinchu (TW)

(72) Inventors: Mean-Jue Tung, Kinmen County (TW); Ming-Da Yang, Taichung (TW); Shi-Yuan Tong, Hsinchu County (TW); Yu-Ting Huang, Hsinchu (TW); Chun-Pin Wu, Tainan (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 198 days.

(21) Appl. No.: 17/129,675

(22) Filed: Dec. 21, 2020

(65) Prior Publication Data
US 2021/0199704 A1 Jul. 1, 2021

(30) Foreign Application Priority Data
Dec. 30, 2019 (TW) ................. 108148274

(51) Int. Cl.
*G01R 29/14* (2006.01)
*H02H 9/04* (2006.01)

(52) U.S. Cl.
CPC ............. *G01R 29/14* (2013.01); *H02H 9/046* (2013.01)

(58) Field of Classification Search
CPC ......... G01R 29/12; G01R 29/14; G01N 27/60
See application file for complete search history.

(56) References Cited

U.S. PATENT DOCUMENTS

| 4,873,489 A | 10/1989 | Melcher et al. |
| 4,947,468 A * | 8/1990 | Nelson ............ G01N 27/60 324/464 |

(Continued)

FOREIGN PATENT DOCUMENTS

| CN | 101216372 A | 7/2008 |
| CN | 103097015 A | 5/2013 |

(Continued)

OTHER PUBLICATIONS

T. Paillat et al., "Capacitive Sensor to Measure Flow Electrification and Prevent Electrostatic Hazards," www.mdpi.com/journal/sensors, pp. 14315-14326 (2012).

(Continued)

*Primary Examiner* — Jeff W Natalini
(74) *Attorney, Agent, or Firm* — Maschoff Brennan

(57) ABSTRACT

An electrostatic sensing system configured to sense an electrostatic information of a fluid inside a fluid distribution component and including an electrostatic sensing assembly, a signal amplifier and an analog-to-digital converter. The electrostatic sensing assembly includes a sensing component, and a shield. The sensing component is configured to be disposed at the fluid distribution component. The sensing component is disposed through the fluid distribution component so as to be partially located in the fluid distribution component. The shield surrounds a part of the sensing component that is located in the fluid distribution component. At least part of the shield is located on an upstream side of the sensing component. The signal amplifier is electrically connected to the sensing component. The analog-to-digital converter is electrically connected to the signal amplifier. The shield has an opening spaced apart from the sensing component.

15 Claims, 3 Drawing Sheets

(56) References Cited

U.S. PATENT DOCUMENTS

| | | | |
|---|---|---|---|
| 5,325,067 A * | 6/1994 | Masuda | H03K 17/955 333/32 |
| 5,350,500 A | 9/1994 | Petzold | |
| 5,705,930 A * | 1/1998 | Forfitt | G01N 27/626 324/553 |
| 6,545,488 B2 | 4/2003 | Yamagishi et al. | |
| 10,006,793 B2 | 6/2018 | Unger et al. | |
| 10,207,237 B2 | 2/2019 | Markel | |
| 10,209,285 B2 | 2/2019 | Wang et al. | |
| 2005/0122118 A1* | 6/2005 | Zank | G01D 9/005 324/457 |
| 2005/0248335 A1 | 11/2005 | Care | |
| 2008/0197853 A1* | 8/2008 | Swift | G01R 29/14 324/457 |
| 2008/0265902 A1 | 10/2008 | Kiminami et al. | |
| 2009/0295400 A1* | 12/2009 | Wilhelm | G01N 15/0266 324/452 |
| 2015/0268027 A1 | 9/2015 | Gerdes | |
| 2015/0346907 A1* | 12/2015 | Nakajima | G06F 3/0445 345/174 |
| 2016/0153819 A1 | 6/2016 | Unger et al. | |
| 2017/0176165 A1 | 6/2017 | Kim | |

FOREIGN PATENT DOCUMENTS

| | | |
|---|---|---|
| CN | 105277804 A | 1/2016 |
| CN | 108267648 A | 7/2018 |
| JP | S51130825 A | 11/1976 |
| JP | S55149924 U | 11/1980 |
| JP | S5631633 A | 3/1981 |
| JP | S61-18880 A | 1/1986 |
| JP | H06502017 A | 3/1994 |
| JP | 2002-5976 A | 1/2002 |
| JP | 2003-303693 A | 10/2003 |
| JP | 2003303695 A | 10/2003 |
| JP | 2008-058141 A | 3/2008 |
| JP | 2008096167 A | 4/2008 |
| JP | 2009-192414 A | 8/2009 |
| JP | 2018-194482 A | 12/2018 |
| TW | 535183 B | 6/2003 |
| TW | 201333792 A | 8/2013 |
| TW | 201623979 A | 7/2016 |

OTHER PUBLICATIONS

T. Paillat et al., "Ester Oils and Flow Electrification Hazards in Power Transformers," IEEE Transactions on Dielectrics and Electrical Insulation, vol. 19, Issue 5, pp. 1537-1543 (Oct. 2012).

A. J. Morin et al., "An Absolute Charge Sensor for Fluid Electrification Measurements," IEEE Transactions on Electrical Insulation, vol. 26, Issue 2, pp. 181-199 (Feb. 1991).

Taiwan Office Action in application No. 108148274 dated Jun. 29, 2020.

JP Office Action in Application No. 2020-207415 dated Jan. 25, 2022.

CN Office Action dated Nov. 17, 2023 as received in Application No. 202010082645.X.

* cited by examiner

ELECTROSTATIC SENSING SYSTEM AND ELECTROSTATIC SENSING ASSEMBLY

CROSS-REFERENCE TO RELATED APPLICATIONS

This non-provisional application claims priority under 35 U.S.C. § 119(a) on Patent Application No(s). 108148274 filed in Taiwan, R.O.C. on Dec. 30, 2019, the entire contents of which are hereby incorporated by reference.

TECHNICAL FIELD

The disclosure relates to an electrostatic sensing system and an electrostatic sensing assembly, more particularly to a contact-type electrostatic sensing system and a contact-type electrostatic sensing assembly.

BACKGROUND

In recent years, as electronic components become small and high-integrated, electrostatic discharge (ESD) causes greater and greater electrostatic damage to the electronic components. However, it is not easy to prevent electrostatic discharge since the electrostatic phenomenon is invisible. The so-called 'electrostatic damage' is resulted from electrostatic phenomenon forming between the circuit modules that are supposed to be electrically isolated from each other, the electrostatic phenomenon creates a short circuit between these modules to damage the integrated circuit (IC). When the electrostatic discharge causes a great current flowing through the IC, the isolation films such as silicon oxide film having high electrical isolation and the inner circuit will be damaged thereby. As the electronic components become smaller and higher-integrated, they become more vulnerable to electrostatic discharge. In the semiconductor industry, approximately 80V to 100V voltage can malfunction the semiconductor. Also, it is known that about 3 KV voltage is enough to get a human to feel pain. Thus, it requires a solution to improve the issues caused by the electrostatic phenomenon.

SUMMARY

One embodiment of this disclosure provides an electrostatic sensing system configured to sense an electrostatic information of a fluid inside a fluid distribution component and including an electrostatic sensing assembly, a signal amplifier and an analog-to-digital converter. The electrostatic sensing assembly includes a sensing component, and a shield. The sensing component is configured to be disposed at the fluid distribution component. The sensing component is disposed through the fluid distribution component so as to be partially located in the fluid distribution component. The shield surrounds a part of the sensing component that is located in the fluid distribution component. At least part of the shield is located on an upstream side of the sensing component. The signal amplifier is electrically connected to the sensing component. The analog-to-digital converter is electrically connected to the signal amplifier. The shield has an opening spaced apart from the sensing component.

Another embodiment of this disclosure provides an electrostatic sensing assembly including a sensing component and a shield. The sensing component is configured to be disposed at the fluid distribution component. The sensing component is disposed through the fluid distribution component so as to be partially located in the fluid distribution component. The shield surrounds a part of the sensing component that is located in the fluid distribution component. At least part of the shield is located on an upstream side of the sensing component. The shield has an opening that is spaced apart from the sensing component.

BRIEF DESCRIPTION OF THE DRAWINGS

The present disclosure will become better understood from the detailed description given herein below and the accompanying drawings which are given by way of illustration only and thus are not intending to limit the present disclosure and wherein.

DETAILED DESCRIPTION

Figure 1:
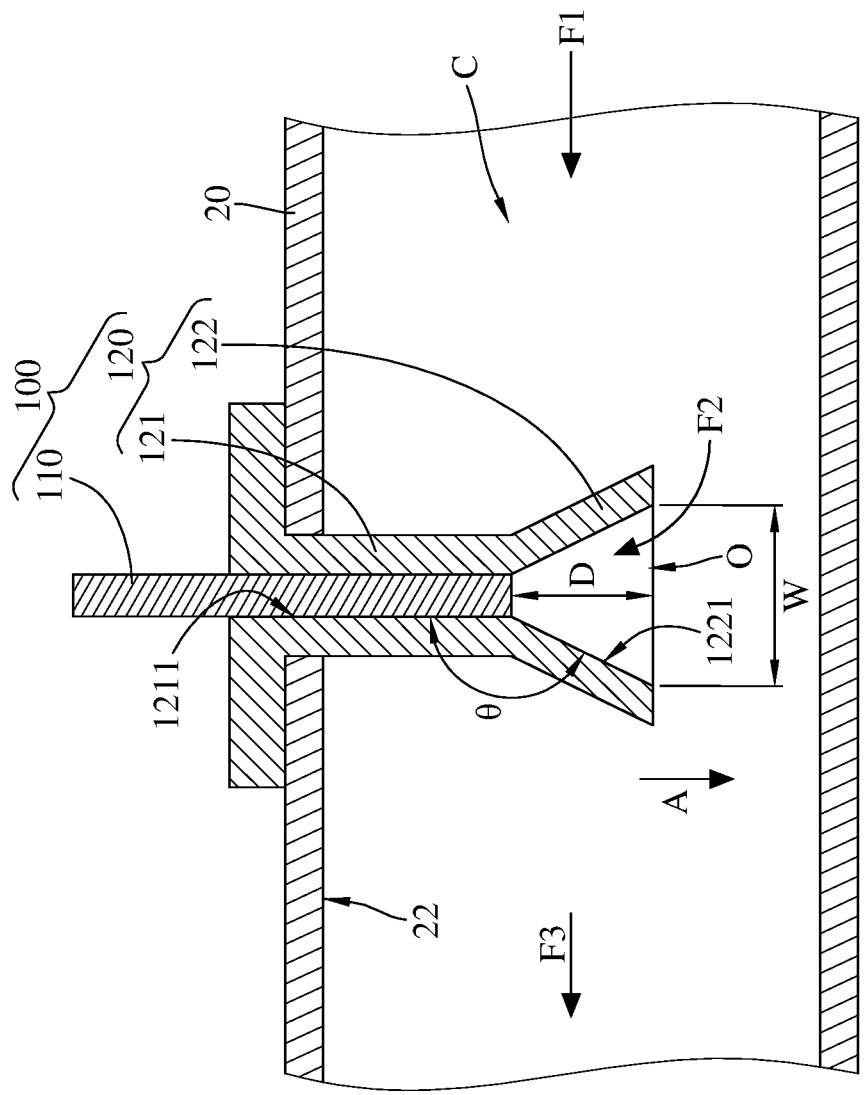
FIG. 1 is a cross-sectional view showing an electrostatic sensing assembly according to a first embodiment of the disclosure being mounted on a fluid distribution component.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Please refer to FIG. 1. FIG. 1 is a cross-sectional view showing an electrostatic sensing assembly according to a first embodiment of the disclosure being mounted on a fluid distribution component.

In one embodiment, an electrostatic sensing assembly 100 is provided and configured to sense the electrostatic properties of a fluid in a fluid distribution component 20 and thus generates an electrostatic information. The fluid distribution component 20 is, for example, a tube or a pump, and the outermost layer of the fluid distribution component 20 is made of, for example, electrical insulating material, such as Teflon (e.g., Perfluoroalkoxy (PFA)). In addition, the fluid distribution component 20 has an inner circumferential surface 22, and the inner circumferential surface 22 forms a channel C allowing the fluid to flow therethrough, where the said fluid is, for example, a high-purity organic solvent, such as negative-tone development (NTD) solvent, ultra-pure water, or butyl acetate. The flowing fluid rubs the fluid distribution component 20 and thereby creates an electrostatic phenomenon.

In this embodiment, the electrostatic sensing assembly 100 includes a sensing component 110 and a shield 120. The sensing component 110 is configured to be disposed through the fluid distribution component 20 so as to be partially located inside the fluid distribution component 20. In this arrangement, the sensing component 110 is able to sense the electrostatic properties of the fluid and thus generate the electrostatic information by being in direct contact with the fluid, which makes the electrostatic sensing assembly 100 have an improved sensing accuracy.

The shield 120 is made of electrical insulating material such as Teflon. The shield 120 is disposed through the fluid distribution component 20 so as to be partially located inside the fluid distribution component 20, and the shield 120 at least surrounds and covers the part of the sensing component 110 that is located inside the fluid distribution component 20. In addition, in this and other embodiments, the fluid in the fluid distribution component 20 flows in a specific direction (e.g., flowing direction F1 shown in FIG. 1), and the fluid will touch part of the shield 120 before touching the sensing component 110; that is, the flow flowing in the flowing direction F1 will reach part of the shield 120 and then reach the sensing component 110. The side of the sensing component 110 where the said part of the shield 120 is located is defined as an upstream side of the sensing component 110. In other words, at least part of the shield 120 is located at the upstream side of the sensing component 110.

In this embodiment, the shield 120 includes a first annular body part 121 and a second annular body part 122. The first annular body part 121 has a first inner surface 1211 substantially perpendicular to the inner circumferential surface 22 of the fluid distribution component 20. The second annular body part 122 has a second inner surface 1221 at an angle θ to the first inner surface 1211 of the first annular body part 121, where the angle θ is larger than 90 degrees and smaller than 270 degrees. In this embodiment, the angle θ between the second inner surface 1221 of the second annular body part 122 and the first inner surface 1211 of the first annular body part 121 is larger than 90 degrees and smaller than 180 degrees, but the disclosure is not limited thereto. In other embodiments, the said angle between the second inner surface of the second annular body part and the first inner surface of the first annular body part may be larger than 180 degrees and smaller than 270 degrees, and in such a range, the inner diameter of the first annular body part should be widened so as to prevent different parts of the second annular body part from being interfered with each other.

The second annular body part 122 has an opening O located away from the first annular body part 121, and the sensing component 110 and the opening O are spaced apart from each other by a distance D. Also, the sensing component 110 and the shield 120 both protrude from the inner circumferential surface 22, where the shield 120 protrudes further than the sensing component 110 from the inner circumferential surface 22.

In this embodiment, the opening O of the shield 120 is defined to be facing towards an opening direction A substantially perpendicular to the flowing direction of the flow (e.g., the directions F1 and F3 shown in FIG. 1). As used herein, the term "substantially perpendicular" refers to an angle between two directions that may or may not have a negligible difference to an exact right angle. However, the opening direction A is not limited to be substantially perpendicular to the flowing directions F1 and F3; in other embodiments, the opening direction may be non-parallel to, such as having an acute angle or an obtuse angle to, the flowing direction of the fluid.

In this embodiment, the distance D between the sensing component 110 and the opening O can make the fluid contact or touch the sensing component 110 at an instant speed near zero or even being zero. In detail, the fluid flowing toward the electrostatic sensing assembly 100 along the direction F1 will be blocked and stopped by the shield 120, which avoids direct impact from the fluid to the sensing assembly 100. Then, the fluid only can flow along the outer surface of the shield 120 and flow into the opening O of the shield 120 along direction F2 and therefore can go into the interior of the shield 120. While the fluid is traveling along the direction F2, its flow speed is largely reduced and may down to nearly zero when reaching the sensing component 110. Then, the fluid may flow out of the shield 120 and flow along the direction F3 away from the sensing component 110.

The opening O has a diameter W having a ratio ranging from 1/3 to 1/1 to the distance D. In this embodiment, the said ratio may be 1/2. Specifically, in one example, the diameter W of the opening O may be 0.5 millimeter (mm), and the distance D between the sensing component 110 and the opening O may be 1 mm, which can make the fluid have an instant flowing speed being nearly zero or even being zero as it touches the sensing component 110. In addition, when the diameter W of the opening O is 1 mm, and the distance D between the sensing component 110 and the opening O is 2 mm, the instant flowing speed of the fluid being in contact with the sensing component 110 is nearly zero or even being zero. When the diameter W of the opening O is 2 mm, and the distance D between the sensing component 110 and the opening O is 5 mm, the instant flowing speed of the fluid being in contact with the sensing component 110 is nearly zero or even being zero. When the diameter W of the opening O is 5 mm, and the distance D between the sensing component 110 and the opening O is 10 mm, the instant flowing speed of the fluid being in contact with the sensing component 110 is nearly zero or even being zero.

As discussed, as long as the said ratio of the diameter W of the opening O to the distance D ranges between the said range (i.e., 1/3-1/1), the shield 120 can provide sufficient protection to the sensing component 110 and reduce the flowing speed of fluid near the sensing component 110 to be nearly zero or even zero, thereby protecting the sensing component 110 from direct impact from the fluid. As such, the sensing component 110 is prevented from being damaged by the fluid. Specifically, the surface layer of the sensing component 110 is prevented from being damaged by the impact from the fluid, such that there will be no debris from the sensing component 110 falling into the fluid. As a result, the purity of the fluid is maintained at the desired level and therefore maintains or even improves the yield rate of the subsequent processes.

Note that the shield 120 is not limited to be disposed through the fluid distribution component 20; in other embodiments, the shield may be disposed within the chamber of the fluid distribution component (e.g., a tube), as long as the shield still can surround the part of the sensing component within the chamber of the fluid distribution component and have a part located on the upstream side of the sensing component.

Figure 2:
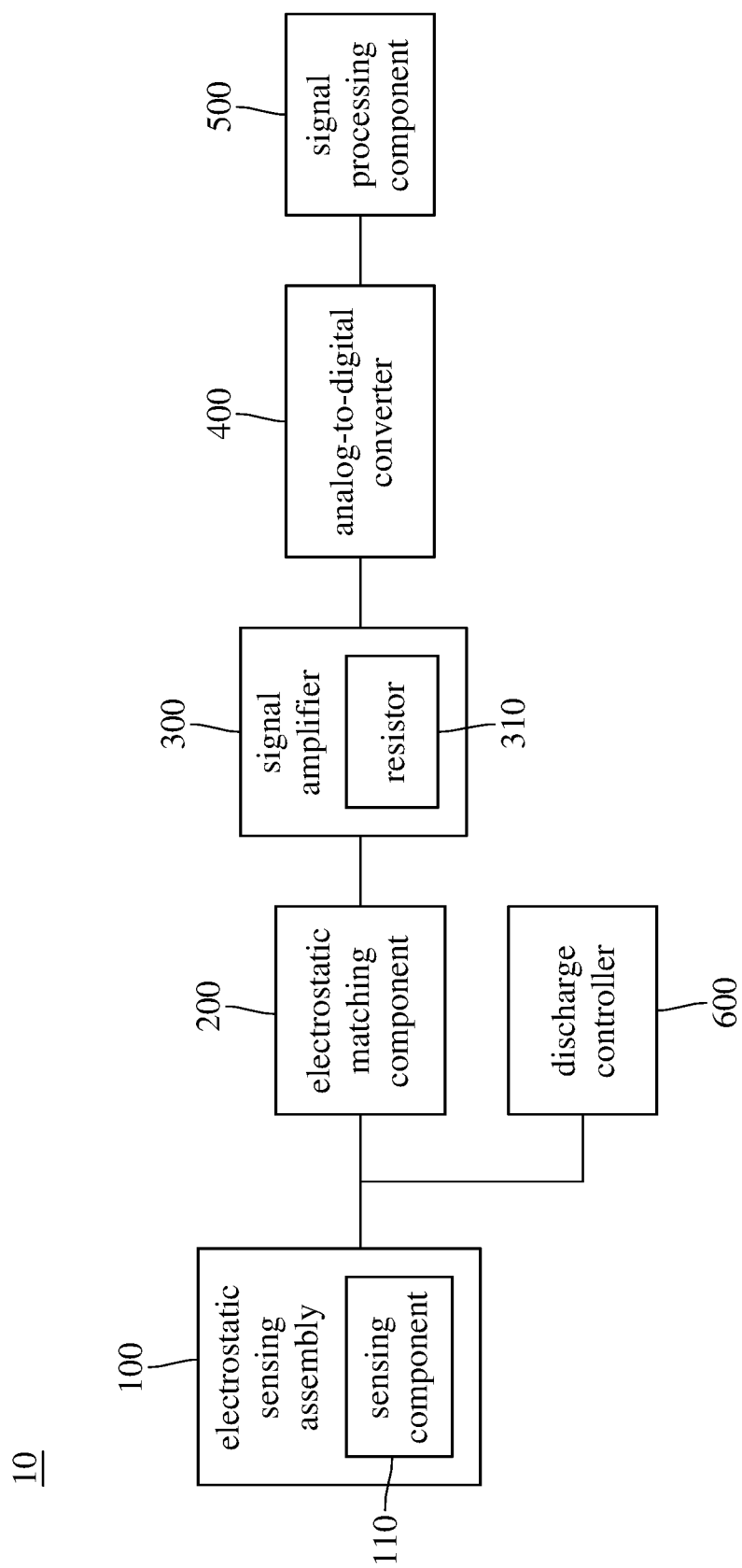
FIG. 2 is a block diagram of an electrostatic sensing system according to the first embodiment of the disclosure.

Then, please further refer to FIG. 2, an electrostatic sensing system 10 is provided, where FIG. 2 is a block diagram of an electrostatic sensing system according to the first embodiment of the disclosure. As shown, the electrostatic sensing system 10 includes an electrostatic sensing assembly 100, an electrostatic matching component 200, a signal amplifier 300, an analog-to-digital converter (ADC) 400, and a discharge controller 600. The electrostatic sensing system 10 may further include a signal processing component 500.

The electrostatic sensing assembly 100 includes a sensing component 110 and a shield 120. As discussed above, the sensing component 110 is configured to be disposed through the fluid distribution component 20 so as to be partially located inside the fluid distribution component 20. The shield 120 at least surrounds and covers the part of the sensing component 110 that is located inside the fluid distribution component 20, and at least part of the shield 120 is located at the upstream side of the sensing component 110. The electrostatic matching component 200 is electrically connected to the sensing component 110. The signal amplifier 300 further includes a resistor 310 electrically connected to the electrostatic matching component 200. The analog-to-digital converter 400 is electrically connected to the resistor 310 of the signal amplifier 300. The discharge controller 600 is electrically connected to the sensing component 110 and the electrostatic matching component 200 so as to make an electrostatic signal match the resistor 310 of the signal amplifier 300. The signal processing component 500 is configured to process the electrostatic signal.

Figure 3:
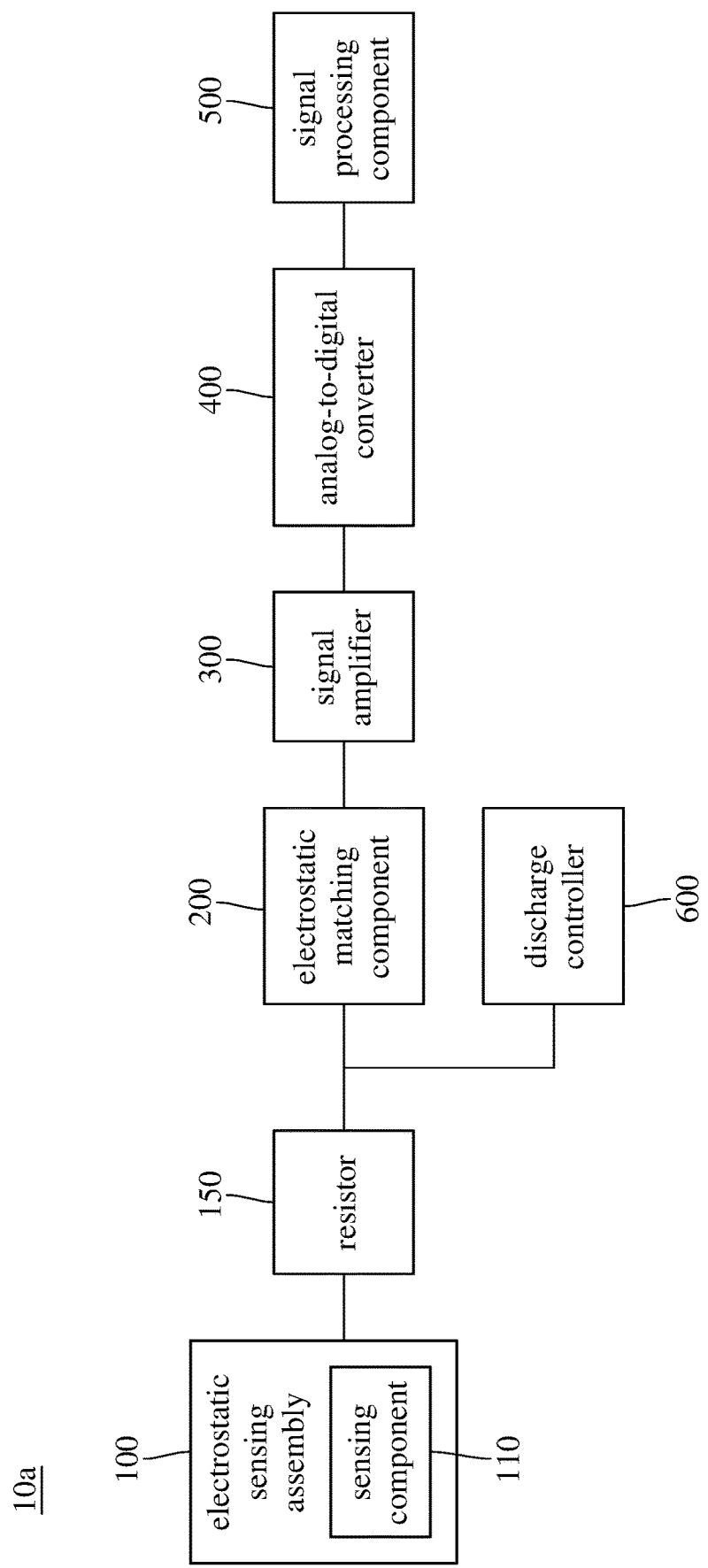
FIG. 3 is a block diagram of an electrostatic sensing system according to a second embodiment of the disclosure.

Please refer to FIG. 1 and further refer to FIG. 3, where FIG. 3 is a block diagram of an electrostatic sensing system according to a second embodiment of the disclosure. An electrostatic sensing system 10a includes an electrostatic sensing assembly 100, a resistor 150, an electrostatic matching component 200, a signal amplifier 300, an analog-to-digital converter 400, and a discharge controller 600. The electrostatic sensing system 10a may further include a signal processing component 500.

The electrostatic sensing assembly 100 includes a sensing component 110 and a shield 120. As discussed above, the sensing component 110 is configured to be disposed through the fluid distribution component 20 so as to be partially located inside the fluid distribution component 20. The shield 120 at least surrounds and covers the part of the sensing component 110 that is located inside the fluid distribution component 20, and at least part of the shield 120 is located at the upstream side of the sensing component 110. The resistor 150 is electrically connected to the sensing component 110. The electrostatic matching component 200 is electrically connected to the resistor 150 in order to prevent the electrostatic signal from being too large. The signal amplifier 300 is electrically connected to the electrostatic matching component 200. The analog-to-digital converter 400 is electrically connected to the signal amplifier 300. The discharge controller 600 is electrically connected to the resistor 150 and the electrostatic matching component 200 so as to make the electrostatic signal match the signal amplifier 300. The signal processing component 500 is configured to process the received electrostatic signal.

According to the electrostatic sensing system and the electrostatic sensing assembly discussed above, the distance between the sensing component and the opening can make the fluid contact or touch the sensing component at an instant speed near zero or even being zero.

In addition, when the ratio of the opening to the distance between the sensing component and the opening ranges from 1/3 to 1/1, more particularly 1/2, the instant flowing speed of the fluid can be closer to zero or even being zero as the fluid is in contact with the sensing component.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. An electrostatic sensing system, configured to sense an electrostatic information of a fluid inside a fluid distribution component, the electrostatic sensing system comprising:
an electrostatic sensing assembly, comprising:
a sensing component, configured to be disposed at the fluid distribution component, and the sensing component disposed through the fluid distribution component so as to be partially located in the fluid distribution component; and
a shield, surrounding a part of the sensing component that is located in the fluid distribution component, wherein at least part of the shield is located on an upstream side of the sensing component;
a signal amplifier, electrically connected to the sensing component; and
an analog-to-digital converter, electrically connected to the signal amplifier;
wherein the shield has an opening spaced apart from the sensing component;
wherein the fluid flowing toward the electrostatic sensing assembly is blocked and stopped by the shield, and a flow speed of the fluid is reduced when reaching the sensing component;
wherein the sensing component has a central axis and a circumferential surface surrounding the central axis, the circumferential surface has an outer part and an inner part connected to each other, the outer part is located outside a channel of the fluid distribution component, the inner part is located in the channel of the fluid distribution component, and the shield covers an entire of the inner part of the circumferential surface.

2. The electrostatic sensing system according to claim 1, wherein the opening is defined to be facing towards an opening direction, and the opening direction is non-parallel to a flowing direction of the fluid.

3. The electrostatic sensing system according to claim 2, wherein the opening direction is substantially perpendicular to the flowing direction.

4. The electrostatic sensing system according to claim 1, wherein the fluid distribution component has an inner circumferential surface, the sensing component and the shield protrude from the inner circumferential surface, and the shield protrudes further than the sensing component from the inner circumferential surface.

5. The electrostatic sensing system according to claim 1, wherein the shield comprises a first annular body part and a second annular body part, a first inner surface of the first annular body part has an angle to a second inner surface of the second annular body part, and the angle is larger than 90 degrees and smaller than 270 degrees.

6. The electrostatic sensing system according to claim 5, wherein the fluid distribution component has an inner circumferential surface that is substantially perpendicular to the first inner surface of the first annular body part.

7. The electrostatic sensing system according to claim 1, wherein the sensing component and the opening are spaced apart from each other by a distance along an extension direction of the sensing component, and a ratio of a diameter of the opening to the distance ranges from 1/3 to 1/1.

8. The electrostatic sensing system according to claim 7, wherein the ratio of the diameter of the opening to the distance is 1/2.

9. The electrostatic sensing system according to claim 1, wherein the shield is made of electrical insulating material.

10. The electrostatic sensing system according to claim 9, wherein the shield is made of a fluorine-based resin.

11. The electrostatic sensing system according to claim 1, further comprising a resistor that electrically connects the sensing component and the signal amplifier.

12. The electrostatic sensing system according to claim 1, wherein the signal amplifier further comprises a resistor that is electrically connected to the sensing component and the analog-to-digital converter.

13. The electrostatic sensing system according to claim 12, further comprising an electrostatic matching component that electrically connects the sensing component and the signal amplifier.

14. The electrostatic sensing system according to claim 1, further comprising a discharge controller that is electrically connected to the sensing component.

15. An electrostatic sensing assembly, comprising:
- a sensing component, configured to be disposed at a fluid distribution component, and the sensing component disposed through the fluid distribution component so as to be partially located in the fluid distribution component; and
- a shield, surrounding a part of the sensing component that is located in the fluid distribution component, and at least part of the shield located on an upstream side of the sensing component;
- wherein the shield has an opening that is spaced apart from the sensing component;
- wherein a fluid inside the fluid distribution component flowing toward the electrostatic sensing assembly is blocked and stopped by the shield, and a flow speed of the fluid is reduced when reaching the sensing component;
- wherein the sensing component has a central axis and a circumferential surface surrounding the central axis, the circumferential surface has an outer part and an inner part connected to each other, the outer part is located outside a channel of the fluid distribution component, the inner part is located in the channel of the fluid distribution component, and the shield covers an entire of the inner part of the circumferential surface.

* * * * *